United States Patent [19]

Des Brisay, Jr. et al.

[11] Patent Number: 4,739,278

[45] Date of Patent: Apr. 19, 1988

[54] DIGITAL PHASE-FREQUENCY DISCRIMINATOR COMPRISING SIMPLIFIED RESET MEANS AND ASSOCIATED METHOD

[75] Inventors: George S. Des Brisay, Jr., Hemet; Iradj Shahriary, Santa Monica, both of Calif.

[73] Assignee: Hughes Aircraft Company, Los Angeles, Calif.

[21] Appl. No.: 797,279

[22] Filed: Nov. 12, 1985

[51] Int. Cl.$^4$ .......................... H03K 5/26; H03K 9/06
[52] U.S. Cl. .................................... 328/133; 307/514; 307/526; 328/134
[58] Field of Search .................. 307/511, 514, , 525, 307/526, 516, 291, 272.2, 279, 479, 262, 271, 443–446, 594, 605; 328/133, 134, 155, 55

[56] References Cited

U.S. PATENT DOCUMENTS

| | | | |
|---|---|---|---|
| 3,610,954 | 10/1971 | Treadway | 328/133 |
| 3,755,746 | 8/1973 | Hogue et al. | 328/133 |
| 4,020,422 | 4/1977 | Underhill | 307/511 |
| 4,177,390 | 12/1979 | Cappon | 307/450 |
| 4,237,423 | 12/1980 | Rhodes | 328/133 |
| 4,291,274 | 9/1981 | Suzuki et al. | 328/133 |
| 4,378,509 | 3/1983 | Hatchett et al. | 307/528 |

FOREIGN PATENT DOCUMENTS 2441174 6/1980 France .
2075294 11/1981 United Kingdom .

OTHER PUBLICATIONS

RCA Cos/Mos Integrated Circuits, "Phase-Locked Loop Building Block for Digital and Analog Applications", ICAN-6101, 1977, pp. 612–615.

Primary Examiner—Stanley D. Miller
Assistant Examiner—Timothy P. Callahan
Attorney, Agent, or Firm—S. M. Mitchell; M. J. Meltzer; A. W. Karambelas

[57] ABSTRACT

A digital phase frequency discriminator is disclosed that eliminates crossover distortion problem inherent in previous discriminator without a corresponding increase in complexity in the circuit. The discriminator includes four cross-coupled RS latches and a reset gate. The reset gate is coupled to the latches such that additional gate delays are provided to ensure that the output signals of the discriminator reach these full logic amplitude and thereby allow for accurate phase frequency discrimination to occur.

20 Claims, 6 Drawing Sheets

4,739,278

DIGITAL PHASE-FREQUENCY DISCRIMINATOR COMPRISING SIMPLIFIED RESET MEANS AND ASSOCIATED METHOD

BACKGROUND OF THE INVENTION

1. Field of the Invention

The present invention relates to phase-frequency discriminators and, more particularly, to digital phase-frequency discriminators.

2. Description of the Related Art

A digital phase-frequency discriminator typically provides an output which is related to a phase or frequency relationship between signals input to the discriminator. For example, in a phase lock loop a digital phase-frequency discriminator often is used to compare a reference signal to a signal derived from the output of a voltage controlled oscillator (VCO), to detect the phase or frequency difference between the two signals and to provide an output signal which is related to this difference. The frequency of oscillation of the VCO then can be changed based upon the output signal to decrease this difference. In this manner, the phase or frequency difference between the signals received by the phase-frequency discriminator can be reduced until it becomes substantially zero, indicating that the phase lock loop is substantially in phase lock.

More particulary, a first earlier digital phase-frequency discriminator (DPFD) is labelled with the reference numeral (12) in the exemplary schematic diagram of FIG. 1. The first earlier DPFD (12) comprises respective first and second RS latches (14, 16), each including two cross-coupled NAND gates. The respective first and second RS latches (14, 16) are shown coupled to receive on their respective S input terminals a reference signal and a signal derived from a VCO output signal, and are coupled to provide respective first and second output signals ($f_1$, $f_2$). The first earlier DPFD (12) further comprises respective third and fourth RS latches (18, 20), each including two cross-coupled NAND gates. It also includes a reset gate (22) which comprises a four-input NAND gate connected as shown. The reset gate (22) includes an output terminal coupled to the respective R input terminals of the respective first, second, third and fourth RS latches (14, 16, 18, 20).

A second earlier DPFD is labelled with the reference numeral (24) in the exemplary schematic diagram of FIG. 2. The second earlier DPFD (24) comprises respective first and second clocked D flip-flops (26, 28) having their respective clear-Q (CQ) terminals coupled to one another. Respective clock pulse (CP) input terminals of the first and second D flip-flops (26, 28) are shown coupled to a reference signal and to a signal derived from a VCO output signal. The respective D input terminals of the respective first and second D flip-flops (26, 28) each have a logical 1 bias signal continuously provided during operation, the respective Q outputs of the respective first and second flip-flops (26, 28) provide respective first and second output signals ($f_1$, $f_2$). The respective $\overline{Q}$ outputs each are fed back into reset gates shown within dashed lines labelled (30) which comprise two NOR gates connected as shown. The reset gates provide a reset signal to the respective clear-Q (CQ) terminals of the respective flip-flops (26, 28).

A third earlier DPFD is labelled with the reference numeral (32) in the exemplary schematic digram of FIG. 3. The third earlier DPFD (32) comprises respective first and second JK flip-flops (34, 36) having their respective clear (C) terminals coupled to one another. Respective clock pulse (CP) input terminals of the first and second JK flip-flops (34, 36) are shown coupled to a reference signal and to a signal derived from a VCO output signal. During operation, respective J input terminals of the respective JK flip-flops (34, 36) are continuously coupled to a logical 1 bias, and respective K input terminals are coupled to electrical ground. The respective Q output terminals provide respective first and second output signals ($f_1$, $f_2$). Additionally, the respective Q output terminals are coupled to the input terminals of a reset gate (38) which comprises a NAND logic gate. An output terminal of the NAND logic gate is coupled to the respective clear (C) terminals of the respective first and second JK flip-flops (34, 36).

While these earlier DPFDs generally have been successful, there have been limitations with their use. For example, the first earlier DPFD (12) suffers from crossover distortion near zero phase error. More specifically, the implementation of the first earlier DPFD (12) ordinarily requires a linear predictable relationship between the phase difference between the input signals provided to the DPFD and the respective output signals ($f_1$, $f_2$) provided by the DPFD. However, when the input signals provided to the first earlier DPFD (12) are nearly in phase with one another, the reset gate (22) can cause the respective output signals ($f_1$,$f_2$) provided by the DPFD (22) to reset before achieving full-logic amplitude levels. Thus, in the region of substantiallY zero phase error, the first earlier DPFD (12) may exhibit crossover distortion which can limit its effectiveness.

The respective second and third DPFDs (24, 32) largely overcome the crossover distortion problem experienced by the first earlier DPFD (12), but they do so at the expense of more complex circuitry. For example, the respective second and third DPFDs (24,32) generally include more gates than the first earlier DPFD (12). In the fabrication of monolithic digital circuits, however, relatively simple circuitry is more desirable because generally it is easier to fabricate, is more reliable and requires less surface area on a semiconductor chip.

Thus, there has been a need for a digital phase-frequency discriminator which substantially does not suffer from crossover distortion near the region of zero phase error and which can be implemented with relatively simple circuitry. The present invention meets this need.

SUMMARY OF THE INVENTION

The present invention comprises a novel digital phase-frequency discriminator including four RS latches and means for providing reset signals to appropriate RS latch terminals. More specifically, the novel discriminator of the present invention comprises a first RS latch coupled to provide first output signals and a second RS latch coupled to provide second output signals. The respective S input terminals of the first and second RS latches are coupled to receive respective first and second input signals. Respective third and fourth RS latches include respective S input terminals coupled to the respective $\overline{Q}$ output terminals of the first and second RS latches. The respective third and fourth RS latches further include respective $\overline{Q}$ output terminals coupled to the respective R input terminals of the first and second RS latches. The digital phase-frequency discriminator of the present invention further comprises a logic gate for providing a reset signal when the first and second input signals both have changed from a first to a second logic state following a common reset of the respective first and second RS latches such that the first and second output signals change back from the second to the first logical state after a reset time interval substantially long enough for the respective first and second output signals to reach full logic amplitude levels for the second logical state.

The present invention also comprises a method for detecting a phase difference between two input signals. The method comprises the steps of first setting first and second output signals to a first logical state. A first input signal is received, and the first output signal is changed from the first logical state to a second logical state in response to the first input signal. A second input signal is received, and the second output signal is changed from the first logical state to the second logical state in response to the second input signal. After the reception of both the first and second input signals, the first and second output signals are reset to the first logical state, the step of resetting occuring after both the first and the second output signals have substantially reached full-logic level amplitudes for the second logical state.

Therefore, the digital phase-frequency discriminator of the present invention can be implemented in integrated circuit form with relatively uncomplicated circuitry. More specifically, it generally can be implemented with fewer logic gates or with logic gates including fewer input terminals than earlier digital phase-frequency discriminators, and thus it provides a relatively reliable device which occupies relatively little area on a semiconductor chip. Furthermore, the novel discriminator substantially does not suffer from cross-over distortion when input signals provided to it are at a near zero phase offset.

These and other features and advantages of the present invention will become more apparent from the following detailed description of an exemplary embodiment thereof, as illustrated in the accompanying drawings.

BRIEF DESCRIPTION OF THE DRAWINGS

The purpose and advantages of the present invention will be apparent to those skilled in the art from the following detailed description in conjunction with the appended drawings in which.

DESCRIPTION OF THE PREFERRED EMBODIMENTS

The present invention comprises a novel digital phase-frequency discriminator. The following description is presented to enable any person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
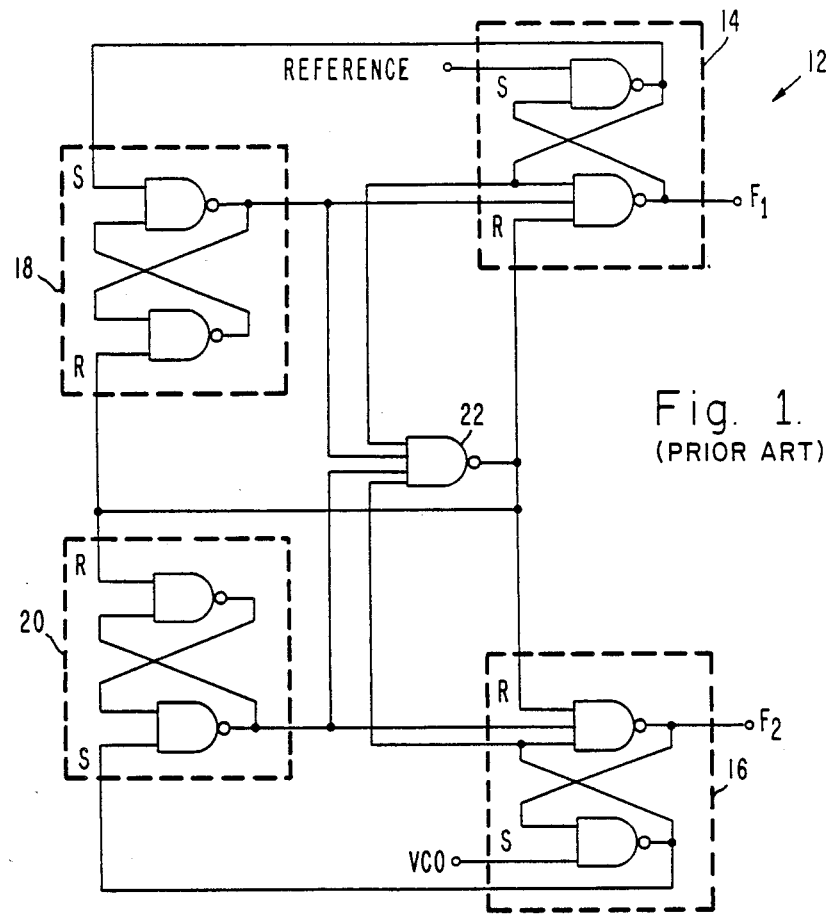
FIG. 1 is a schematic diagram of a first earlier digital phase-frequency discriminator.
Figure 2:
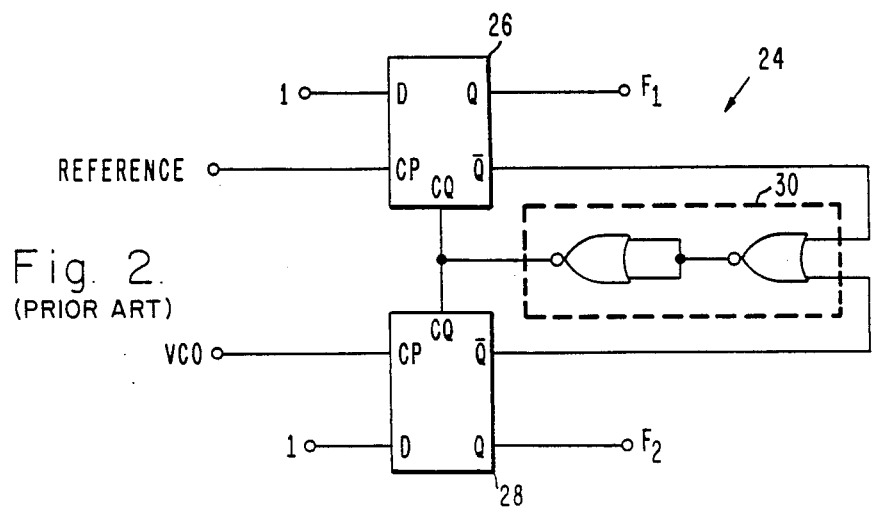
FIG. 2 is a schematic diagram of a second earlier digital phase-frequency discriminator.
Figure 4:
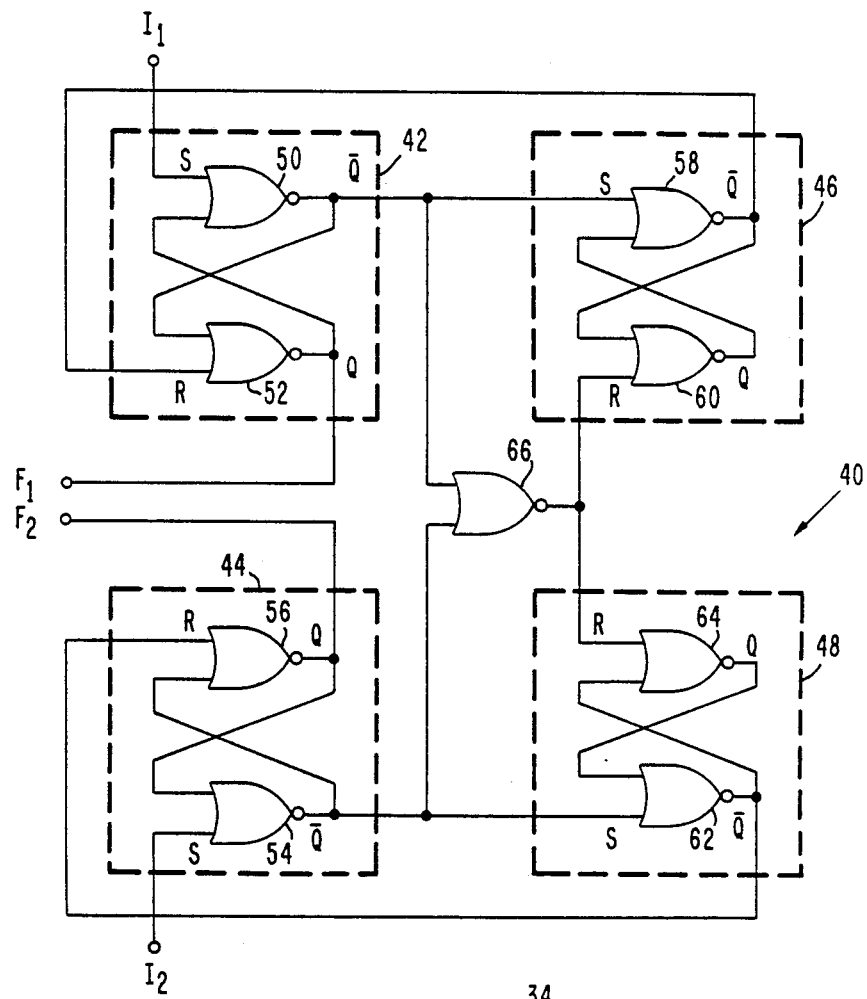
FIG. 4 is a schematic diagram of a first embodiment of the present invention.
Figure 3:
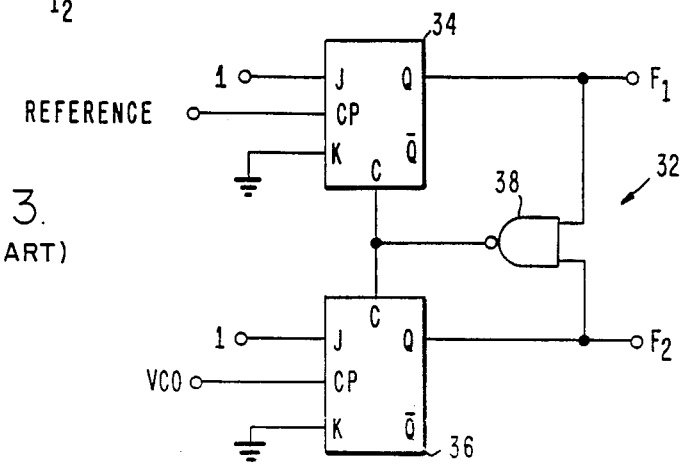
FIG. 3 is a schematic diagram of a third earlier digital phase-frequency discriminator.

Referring to the illusrative drawings of FIG. 4, there is shown a first embodiment (40) of a digital phase-frequency discriminator (DPFD) of the present invention. The first embodiment (40) includes four respective RS latches indicated by dashed lines labelled (42), (44), (46) and (48). Each respective latch comprises a pair of two-input NOR gates which are cross-coupled.

A first RS latch (42) includes respective first and second NOR gates (50) and (52), each comprising two input terminals. One input terminal of the first NOR gate (50) serves as an S input terminal, and one input terminal of the second NOR gate (52) serves as an R input terminal. The other input terminal of the first NOR gate (50) is cross-coupled to an output terminal of the second NOR gate (52), and the other input terminal of the second NOR gate (52) is cross-coupled to an output terminal of the first NOR gate (50). The output terminal of the first NOR gate (50) provides a $\overline{Q}$ output signal, and the output terminal of the second NOR gate (52) provides a Q output signal.

Similarly, a second RS latch (44) includes respective second and third NOR gates (54) and (56), each comprising two input terminals. One input terminal of the third NOR gate (54) serves as an S input terminal, and one input terminal of the fourth NOR gate (56) serves as an R input terminal. The other input terminal of the third NOR gate (54) is cross-coupled to an output terminal of the fourth NOR gate (56), and the other input terminal of the fourth NOR gate (56) is cross-coupled to an output terminal of the third NOR qate (54). The output terminal of the third NOR gate (54) provides a $\overline{Q}$ output signal, and the output terminal of the fourth NOR gate (56) provides a Q output signal.

A third RS latch (46) includes respective fifth and sixth NOR gates (58) and (60), each comprising two input terminals. One input terminal of the fifth NOR gate (58), which serves as an S input terminal, is coupled to the $\overline{Q}$ output terminal of the first RS latch (42). One input terminal of the sixth NOR gate (60) serves as an R input terminal for the third RS latch (46). The other input terminal of the fifth NOR gate (58) is cross-coupled to an output terminal of the sixth NOR gate (60), and the other input terminal of the sixth NOR gate (60) is cross-coupled to an output terminal of the fifth NOR qate (58). The output terminal of the fifth NOR gate (58) provides a $\overline{Q}$ output signal, and the output terminal of the sixth NOR qate (60) provides a Q output signal.

Similarly, a fourth RS latch (48) includes respective seventh and eighth NOR gates (62) and (64), each comprising two input terminals. One input terminal of the seventh NOR gate (62), which serves as an S input terminal, is coupled to the the $\overline{Q}$ output terminal of the second RS latch. One input terminal of the eighth NOR gate (64) serves as an R input terminal for the fourth RS latch (48). The other input terminal of the seventh NOR gate (62) is cross-coupled to an output terminal of the eighth NOR gate (64), and the other input terminal of the eighth NOR qate (64) is cross-coupled to an output terminal of the seventh NOR gate (62). The output terminal of the seventh NOR gate (62) provides a $\overline{Q}$ output signal, and the output terminal of the eighth NOR gate (64) provides a Q output signal.

The S input terminal of the first NOR qate (50) is coupled to receive first input signals $I_1$, and the S input terminal of the third NOR gate (54) is coupled to receive second input signals $I_2$. Furthermore, the $\overline{Q}$ output terminal of the third RS latch (46) is coupled to the R input terminal of the first RS latch (42), and the $\overline{Q}$ output terminal of the fourth RS latch (48) is coupled to the R input terminal of the second RS latch (44). Additionally, the Q output terminal of the first RS latch (42) is coupled to provide first output signals, $F_1$, and the Q output terminal of the second RS latch (44) is coupled to provide second output signals, $F_2$.

A reset NOR gate (66) is coupled to provide reset signals to the respective third and fourth RS latches (46) and (48). More particularly, the reset NOR gate (66) includes respective first and second input terminals coupled to the respective $\overline{Q}$ output terminals of the first and second RS latches (42) and (44), and it includes an output terminal coupled to the respective R input terminals of the respective third and fourth RS latches (46) and (48).

Figure 5:
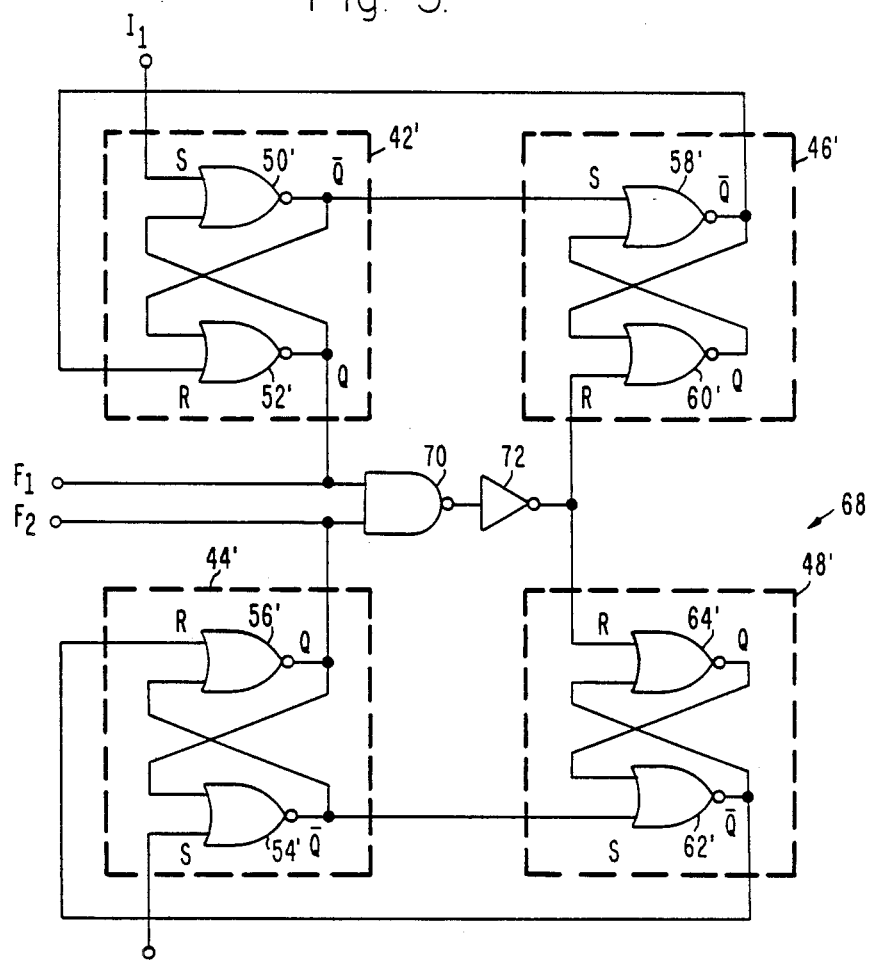
FIG. 5 is a schematic diagram of a second embodiment of the present invention.

Referring to the exemplary drawinqs of FIG. 5, there is shown a second embodiment (68) of the present invention. One will appreciate that the constituents of the respective first and second embodiments (40) and (68) are substantially identical to one another, except for their respective reset gates as will be more fully explained below. Therefore, only the reset gates of the second embodiment (68) will be described herein in detail. Constituents of the second embodiment (68), which are the same as those of the first embodiment (40), are labelled in FIG. 5 with primed reference numerals identical to those of the corresponding constituents of the first embodiment (40).

The reset gates of the second embodiment (68) comprise a two-input NAND gate (70) and an inverter gate (72). The respective input terminals of the NAND gate (70) are coupled to the respective Q output terminals of the respective first and second RS latches (42') and (44'). An output terminal of the NAND oate (70) is coupled to an input terminal of the inverter gate (72), and an output terminal of the inverter gate (72) is coupled to the respective R input terminals of the third and fourth RS latches (46') and (48').

Figure 6:
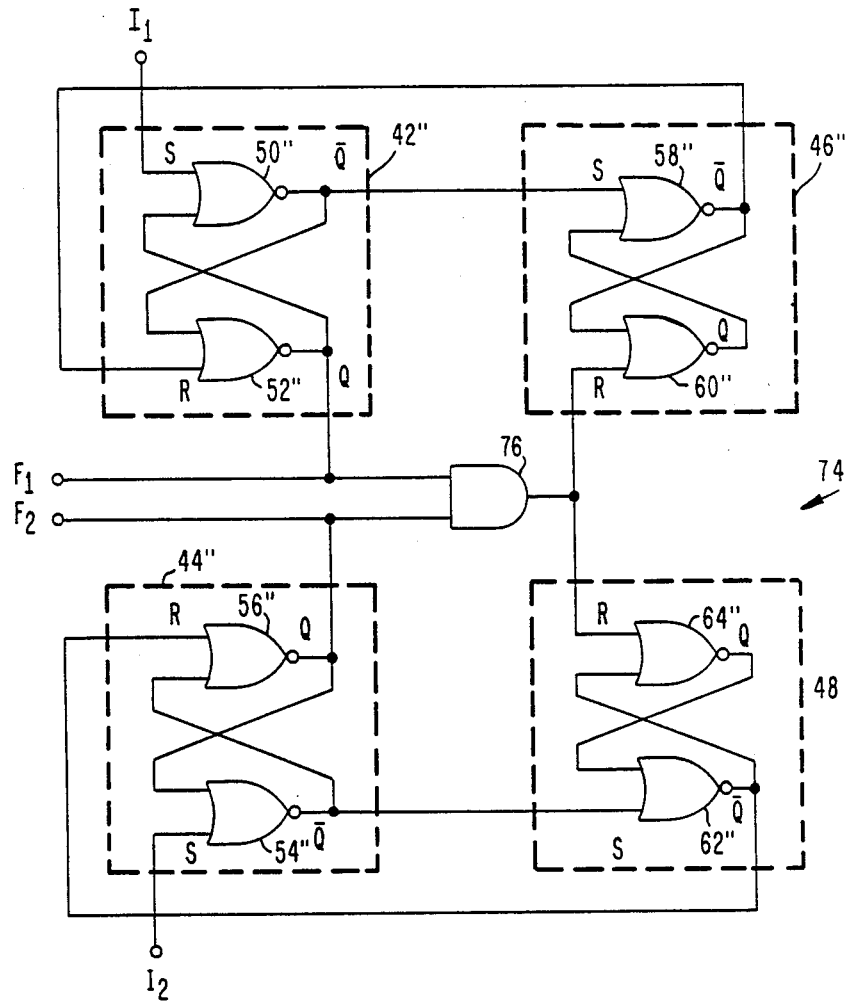
FIG. 6 is a schematic diagram of a third embodiment of the present invention.

Referring now to the exemplary drawings of FIG. 6, there is shown a third embodiment (74) of the present invention. One will appreciate that the constituents of the respective first and third embodiments (40) and (74) are substantially identical to one another, except for their respective reset gates as will be more fully explained below. Therefore, only the reset gates of the third embodiment (72) will be described herein in detail. Constitutents of the third embodiment (74), which are the same as those of the first embodiment (40), are labelled in FIG. 6 with double primed reference numerals identical to those of corresponding constituents of the first embodiment (40).

The reset gate of the third embodiment (74) comprises an AND gate (76). The AND (76) gate includes two respective input terminals coupled to the respective Q output terminals of the respective first, second and RS latches (42") and (44"). An output terminal of the AND gate (76) is coupled to the respective R input terminals of the respective third and fourth RS latches (46") and (48").

Figure 7:
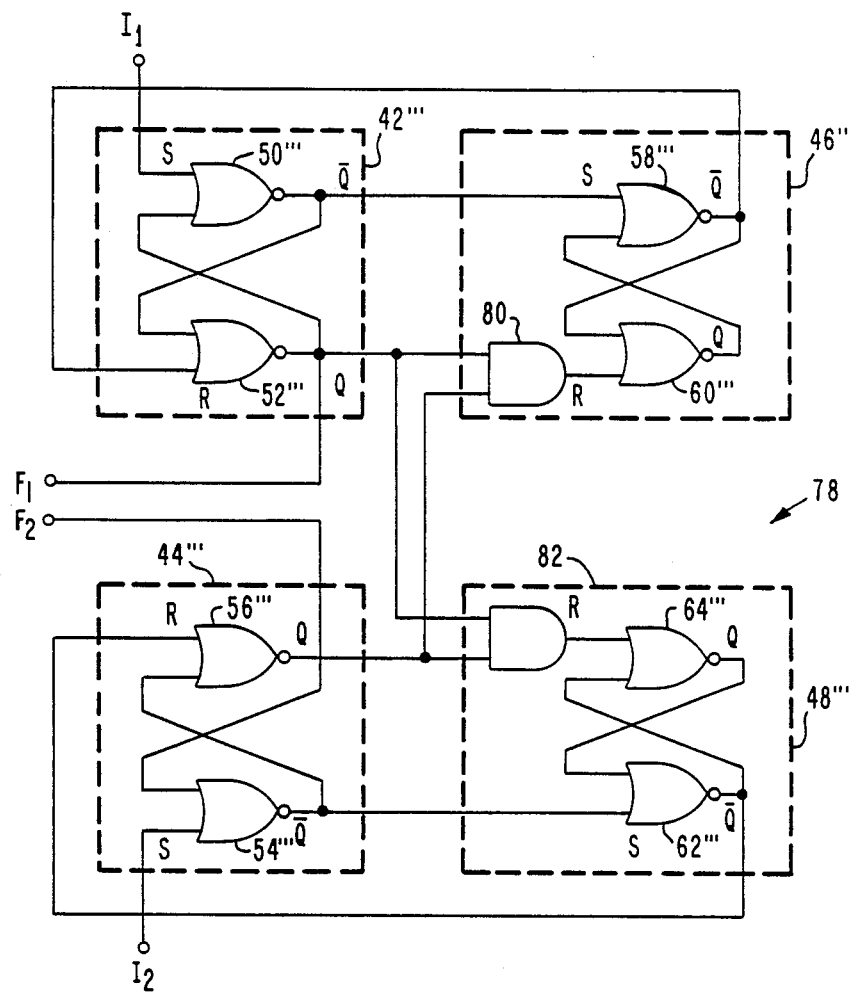
FIG. 7 is a schematic diagram of a fourth embodiment of the present invention.

Referring to the exemplary drawings of FIG. 7, there is shown a fourth embodiment (78) of the present invention. One will appreciate that the constituents of the respective first and fourth embodiments (40) and (78) are substantially identical to one another, except for their respective reset gates as will be more fully explained below. Therefore, only the reset gates of the fourth embodiment (78) will be described herein in detail. Constitutents of the fourth embodiment (78) which are the same as those of the first embodiment (40) are labelled in FIG. 7 with triple primed reference numerals identical to those of the corresponding constituents of the first embodiment (40).

More particularly, the reset qates of the fourth embodiment (78) comprise respective first and second merged AND gates (80) and (82) which respectivley are merged with the sixth and eighth NOR logic gates (60''') and (64'''). Merged logic structures such as those ilustrated in FIG. 7 are well known in the art. Briefly, a merged logic structure is one in which there is substantially only one inversion propagation delay between the provision of an input signal and the reception of a corresponding resultant output signal. For example, U.S. Pat. No. 4,177,390, issued to Cappon on Dec. 4, 1979, describes typical merged logic structures. Thus, those skilled in the art will understand how to make and use merged logic structures such as those described with reference to FIG. 7.

The first merged AND gate (80) comprises two input terminals, one coupled to the Q output terminal of the first RS latch (42''') and the other coupled to the Q output terminal of the second RS latch (44'''). The first merged AND qate (80) also comprises an output terminal coupled to the R input terminal of the third RS latch (46''').

The second merged AND gate (82) also comprises two input terminals, one coupled to the Q output terminal of the first RS latch (42''') and the other coupled to the Q output terminal of the second RS latch (44'''). The second merged AND gate (82) also comprises an output terminal coupled to the R input terminal of the fourth RS latch (48''').

It will be appreciated that the novel DPFD described with regard to FIGS. 4–7 can be implemented in integrated circuit form using substantially non-complex circuitry. Therefore, the present invention can provide a more compact and reliable DPFD.

Figure 8:
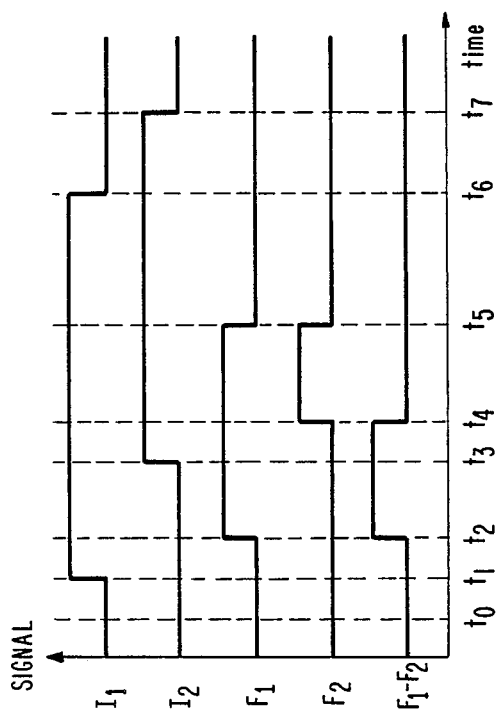
FIG. 8 is an exemplary timing diagram illustrating the operation of the embodiments of FIG. 4.

The operation of the novel DPFD of the present invention will be understood from the following description in conjunction with the illustrative timing diagram of FIG. 8. Although the operation of the DPFD will be explained with reqard to the first embodiment (40), it will be appreciated that the remaining embodiments each operate based upon similar principles which will be understood by those skilled in the art. Additionally, it will be understood that the following description of the operation of the present invention applies positive logic, and that an equivalent description could be set forth using negative logic.

In the exemplary timing diagram of FIG. 8, the respective first and second RS latches (42) and (44) initially at time $t_0$ are in their reset condition: Q in a logical state 0 and $\overline{Q}$ in a logical 1 state. Thus, initially the respective first and second output signals, $F_1$ and $F_2$, also are in the logical 0 state. Futhermore, the respective third and fourth RS latches enclosed within dashed lines (46) and (48) initially are in their set condition: Q in a logical state 1 and $\overline{Q}$ in a logical state 0. Finally, the respective first and second input signals, $I_1$ and $I_2$, initially are in the logical 0 state.

At time $t_1$, the first input signal, $I_1$, changes from a logical 0 to a logical 1 state. Consequently, the first RS latch (42) becomes set, and at time $t_2$ the first output signal, $F_1$, changes from a logical 0 to a logical 1 state. The time interval between $t_1$ and $t_2$ substantially equals two inversion gate propagation delays. The second output signal, $F_2$, however, remains unchanged. One will appreciate that any additional changes in the logical state of the first input signal, $I_1$, at this point, without a change in the logical state of the second input singal, $I_2$, will produce no further changes in the set or reset conditions of any of the four RS latches.

At time $t_3$, the second input signal, $I_2$, changes from a logical 0 state to a logical 1 state. Consequently, the second RS latch (44) becomes set, and at time $t_4$ the second output signal changes from a logical 0 to a logical 1 state. The time interval between $t_3$ and $t_4$ substantially equals two inversion gate propagation delays. At time $t_4$, the input signals provided to the respective input terminals of the reset NOR gate (66) both have become logical 0s causing its output terminal to provide a logical 1 state signal to the respective R terminals of the respective third and fourth RS latches (46) and (48). Consequently, the third and fourth latches become reset.

Following this reset, the third RS latch (46) provides a logical 1 state signal to the R input terminal of the first RS latch (42) and the fourth RS latch (48) provides a logical 1 state signal to the R input terminal of the second RS latch (44). Thus, at time $t_5$ the respective first and second output signals, $F_1$ and $F_2$, provided by the first and second RS latches (42) and (44) change from the logical 1 state to the logical 0 state. The time interval between $t_4$ and $t_5$ substantially equals three inversion gate propagation delays.

Therefore, the change in the first and second output signals, $F_1$ and $F_2$, from the logical 1 to the logical 0 state after the second output signal, $F_2$, changes to the logical 1 state is not an instantaneous change. Rather, the time interval between times $t_4$ and $t_5$, which is the reset time interval, is long enough for each of the output signals, $F_1$ and $F_2$, to reach full logical 1 state amplitiude levels before the transition back to the logical 0 state.

The length of the reset time interval is larqely determined by the nature of the reset gates and the manner in which they couple the respective first and second RS latches (42) and (44) to the respective third and fourth RS latches (46) and (48). Maintaining a reset time interval which is at least long enouoh for the first and second output signals, $F_1$ and $F_2$, to obtain full-logic ampitude levels is important in order to avoid crossover distortion when the first and second input signals, $I_1$ and $I_2$, are at or near zero phase difference.

Thus, it is necessary that the reset NOR gate (66) provide reset signals which do not change the first and second output signals, $F_1$ and $F_2$, from logical 1 to logical 0 states until both output signals have achieved their full logical 1 amplitude levels. This will ensure that additonal circuitry, which forms no part of the present invention, will be provided with output signals exhibiting full loqic amplitude levels even when both the first and second input signals, $I_1$ and $I_2$, occur virtually simultaneously, as when the input signals are substantialy in phase with each other. It will be appreciated that failure to achieve full logic amplitude levels at or near phase crossover (zero phase offset) can inhibit accurate phase discrimination at or near phase crossover.

Furthermore, it will be appreciated that, at time $t_5$, the first and second output signals, $F_1$ and $F_2$, change from logical 1 to logical 0 states regardless of whether or not either or both of the input signals, $I_1$ and $I_2$, have changed from a logical 1 to a logical 0 state. When either or both of the input signals, $I_1$ or $I_2$, delays changing from the logical 0 to the logical 1 state until after time $t_5$ when the output signals, $F_1$ and $F_2$, transition from logical 1 to logical 0 states, then the affected RS latch (either the first or the second RS latch) will delay the completion of its reset ($\overline{Q}$ changes to logical 1 state) its corresponding input signal changes from a logical 1 to a logical 0 state. At that time, the latch will complete its reset, causing its associated latch (either the third or fourth RS latch) to become set.

Accordingly, it will be appreciated that at time $t_6$, when the first input signal, $I_1$, changes from a logical 1 to a logical 0 state, the first latch (42) will become reset and its $\overline{Q}$ output will transition to a logical 1 state. Consequently, the third latch (46) will become set and its $\overline{Q}$ output will transition to a logical 0 state.

Furthermore, at time $t_7$, when the second input signal, $I_2$, changes from a logical 1 to a logical 0 state, the second latch (44) will become reset, and its $\overline{Q}$ output will transition to a logical 1 state. As a result, the fourth latch (48) will become set, and its $\overline{Q}$ output will transition to a logical 0 state.

Thus, after time $t_7$, the DPFD of the present invention is ready to respond to the next series of input signals.

A characteristic of the discriminator of the present invention is that it will produce an output of the correct sense in response to a frequency difference of two input pulse streams. This occurs because the higher frequency input signal will consistently be the first to set its associated RS latch (after a common reset), and the lower frequency input signal will consistently be the one to produce the common reset. This will result in minimum width pulses occurring at the Q output terminal of the RS latch (either the first or second RS latch) associated with the low frequency input signal and varying width pulses occurring at the other Q output terminal.

It will be understood that the digital phase-frequency discriminator described with reference to the four embodiments descibed in detail herein is an edge-triggered device. As described above, the first input signal to change from a logical 0 to a logical 1 state causes an associated output signal to change from a logical 0 to a logical 1 state. Similarly, the next input signal to change from a logical 0 to a logical 1 state causes an associated output signal to change from a logical 0 to a logical 1 state, and it also initiates the reset of both output signals from the logical 1 to the logical 0 state as described above. This action produces output signal pulses which can be differenced by appropriate cirucitry, described below with reference to FIG. 9, to produce a substantially linear voltage versus phase discriminant of the phase relationship between respective input pulse streams provided by the respective first and second input signals, $I_1$ and $I_2$.

For example, referring to FIG. 8, the time interval between times $t_2$ and $t_4$ substantially represents the period of time equal to the time between the moment when the first input signal, $I_1$, changes from a logical 0 to a logical 1 state and the moment when the second input signal, $I_2$, changes from a logical 0 to a logical 1 state. This time interval is indicative of the phase offset between the respective first and second signals, $I_1$ and $I_2$.

Figure 9:
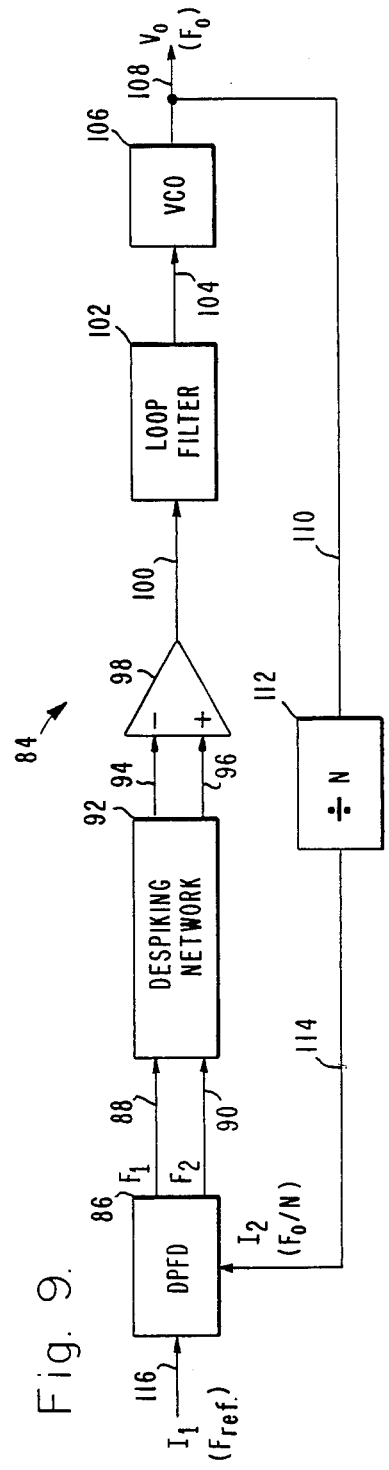
FIG. 9 is a block diagram of an exemplary operative environment illustrating the use of the present invention.

The following description with reference to the illustrative drawings of FIG. 9 illustrates the use of the DPFD of the present invention in an operative environment. It will be understood, that although one operative environment will be illustrated and described, the DPFD of the present invention can be used in other operative environments as well.

In FIG. 9, there is shown an exemplary phase lock loop frequency synthesizer (84) incorporating the novel digital phase-frequency detector (DPFD) (86) of the present invention. It will be understood that the DPFD (86) may comprise any of the embodiments described above. The DPFD (86) is coupled by lines (88) and (90) to a despiking network (92). The despiking network (92) is coupled by lines (94) and (96) to a difference amplifier circuit (98). The difference amplifier circuit (98) is coupled by line (100) to a loop filter (102), and the loop filter (102) is coupled by line (104) to a voltage controlled oscillator (VCO) (106). The VCO (106) provides an output signal $V_0$, at a synthesized frequency, $F_o$, on line (108). Feedback line (110) couples line (108) to a divide-by-N programmable divider (112), and feedback line (114) couples the programmable divider (112) to the DPFD (86). Line (116) couples the DPFD (86) to a reference frequency source (not shown).

In operation, the DPFD (86) receives a first input signal, $I_1$, at a reference frequency, $F_{ref}$, on line (116) and receives a second input signal, $I_2$, at an integer division ratio of the synthesized frequency ($F_o/N$), on line (114). The DPFD (86) processes the signals substantially as described above with reference to FIG. 8 and provides the respective first and second output signals, $F_1$ and $F_2$, on respective lines (88) and (90). It will be appreciated from the discussion above, and particularly from the portion of the timing diagram of FIG. 8 labelled $F_1-F_2$, that the relationship between the first and second output signals, $F_1$ and $F_2$, is determined by the phase and frequency difference between the first and second input signals, $I_1$ and $I_2$, provided to the DPFD (86). The despiking network (92) slows the rise time of the respective first and second output signals, $F_1$ and $F_2$, on lines (88) and (90) and provides corresponding resultant signals on respective lines (94) and (96) to the respective negative and positive terminals of the difference amplifier (98.)

The difference amplifier (98) essentially ascertains the length of time between time $t_1$ and $t_3$ which, of course, is related to the phase and frequency difference between the first and second input signals, $I_1$ and $I_2$. It then provides an output signal on line (100) in which the voltage is substantially related to the phase or frequency difference between the first and second input signals, $I_1$, and $I_2$, provided to the DPFD (86) on lines (116) and (114). The loop filter (102) attenuates reference, phase noise and unwanted components of the reference frequency from signals provided on line (100) and provides the resultant control signal on line (104) to the VCO (106). The VCO (106), in turn, adjusts the synthesized frequency, $F_o$, based upon the value of the signal control received on line (104).

Feedback line (110) provides a signal substantially at the synthesized frequency $F_0$ to the divde-by-N programmable divider (112) which, in turn, provides the second input signal, $I_2$, at frequency, ($F_o/N$), on line (114) to the DPFD (86). Thus, output signals, $F_1$ and $F_2$ provided by the DPFD (86) are used to provide a VCO output signal $V_o$ at a desired synthesized output frequency, $F_o$.

Thus, in the operative environment of the phase lock loop frequency synthesizer (84) described with reference to FIG. 9, the DPFD (86) of the present invention provides respective first and second output signals, $F_1$ and $F_2$, which are used as a measure of the phase offset or the frequency sense between the respective first and second input signals, $I_1$, and $I_2$. Since the reset of the respective first and second latches (42) and (44) is delayed for a period of time equal to the reset time interval (the time between $t_4$ and $t_5$ in FIG. 8 and the respective output signals, $F_1$ and $F_2$, have time to reach full logic amplitude levels before this reset, the DPFD (86) can provide accurate output signals even when the respective input signals, $I_1$ and $I_2$, are at or near zero phase offset.

Furthermore, since the DPFD of the present invention uses relatively simple RS latches comprising cross-coupled two input NOR gates and since its reset gates are relatively simple, the DPFD of the present invention is relatively compact and reliable and occupies relatively little space on a semiconductor chip.

It will be understood that the embodiments described above are merely illustrative of many possible specific embodiments which can represent the principles of the invention. Numerous and varied other arrangements can readily be devised in accordance with these principles without departing from the spirit and scope of the invention. For example, although the present embodiments illustrated herein incorporate RS latches comprising cross-coupled NOR gates, those skilled in the art will appreciate that the duals of the embodiments illustrated are equivalent to the embodiments described herein. The dual of the first embodiment, for example, includes RS latches comprising cross-coupled NAND gates and a reset gate comprising a reset NAND gate. Of course, if the dual of any of the above embodiments is employed, negative logic will be most conveniently applied to describe its operation. Furthermore, although certain reset gate configurations are described and illustrated herein, it will be appreciated that other reset gate configurations may suffice and may fall within the scope of the present invention. Thus, the foregoing description is not intended to limit the invention which is defined by the appended claims in which:

What is claimed is:

1. A phase-frequency discriminator comprising:
   a first RS latch for providing first output signals via a Q output terminal and third output signals via a $\overline{Q}$ output terminal, said first RS latch including an S input terminal for receiving first input signal and an R input terminal;
   a second RS latch for providing second output signals via a Q output terminal and fourth output signals via a $\overline{Q}$ output terminal, said second RS latch including an S terminal for receiving second input signals and an R input terminal;
   a third RS latch including an S input terminal coupled to the $\overline{Q}$ output terminal of said first RS latch and including a Q output terminal coupled to the R input terminal of said first RS latch, the third RS latch also having an R input terminal;

a fourth RS latch including an S input terminal coupled to the $\overline{Q}$ output terminal of said second RS latch and including a $\overline{Q}$ output terminal coupled to the R input terminal of said second RS latch, the fourth RS latch also including an R input terminal; and reset means including two input terminals and an output terminal, one of the input terminals coupled to the $\overline{Q}$ output terminal of the first RS latch and the other one of the input terminals coupled to the $\overline{Q}$ output terminal of the second RS latch, the output terminal of the reset means being coupled to the respective R input terminals of the respective third and fourth RS latches and providing a reset signal to said third and fourth RS latches when said first and second input signals both have changed from a first to a second logical state, said third and fourth RS latches thereby providing a common reset of said first and second RS latches wherein, the first and second output signals change back from the second to the first logical state after a reset time interval between the provision of the second input signal and the common resetting of the first and second RS latches, said reset time interval being substantially long enough for the respective first and second output signals to reach full-logic amplitude levels for the second logical state and wherein the differene between the first and second output signals is representative of the phase-frequency relationship between the first and second input signals.

2. The phase-frequency discriminator of claim 1 wherein said reset time interval is long enough for the respective first and second output signals to substantially reach full-logic amplitude levels even when the first and second input signals are substantially zero degrees out of phase with one another.

3. The phase-frequency discriminator of claim 2 wherein each of said RS latches is unclocked.

4. The phase-frequency discriminator of claim 3 wherein each respective RS latch comprises two respective NOR gates.

5. The phase-frequency discriminator of claim 4 wherein the respective NOR gates comprising said respective RS latches each have two input terminals.

6. The phase-frequency discriminator of claim 5 wherein said respective NOR gates comprising said respective RS latches are cross-coupled.

7. The phase-frequency discriminator of claim 6 wherein said reset means comprises a NOR gate including one input terminal coupled to the $\overline{Q}$ output terminal of said first RS latch and including another input terminal coupled to the $\overline{Q}$ output terminal of said second RS latch, said NOR gate including an output terminal coupled to the respective R input terminals of said respective third and fourth RS latches.

8. The phase-frequency discriminator of claim 6 wherein said reset means comprises:
a NAND gate; and
an inverter gate;
wherein said NAND gate includes one input terminal coupled to the Q output terminal of said first RS latch and another input terminal coupled to the Q output terminal of said second RS latch and an output terminal coupled to an input terminal of said inverter gate; and
wherein said inverter gate includes an output terminal coupled to the respective R input terminals of said respective third and fourth RS latches.

9. The phase-frequency discriminator of claim 6 wherein said reset means comprises:
a first AND gate, including one input terminal coupled to the Q output terminal of said first RS latch and including another input terminal coupled to the Q output terminal of said second RS latch, said first AND gate including an output terminal coupled to the R input of said third RS latch; and
a second AND gate, including one input terminal coupled to the Q output terminal of said first RS latch and including another input terminal coupled to the Q output terminal of said second RS latch, said second AND gate including an output terminal coupled to the R input of said fourth RS latch.

10. The phase-frequency discriminator of claim 9 wherein said first AND gate is merged to the NOR gate providing the Q output for said third RS latch; and said second AND gate is merqed to the NOR gate providing the Q output for said fourth RS latch.

11. The phase-frequency discriminator of claim 6 wherein said reset means comprises an AND gate including one input terminal coupled to the Q output terminal of said first RS latch and including another input terminal coupled to the Q output terminal of said second RS latch, said AND qate including an output terminal coupled to the respective R input terminals of said respective third and fourth RS latches.

12. The phase-freouency discriminator of claim 4 wherein each of said RS latches comprises two cross-coupled NAND gates.

13. The phase-frequency discriminator of claim 12 wherein the respective NAND gates comprising said respective RS latches each have two input terminals.

14. The phase-frequency discriminator of claim 13 wherein each of said respective NAND gates comprising said respective RS latches are cross-coupled.

15. The phase-frequency discriminator of claim 14 wherein said reset means comprises a NAND gate including one input terminal coupled to the $\overline{Q}$ output terminal of said first RS latch and including another input terminal coupled to the $\overline{Q}$ output terminal of said second RS latch, said reset NAND gate including an output terminal coupled to the respective R input terminals of said respective third and fourth RS latches.

16. The phase-frequency discriminator of claim 14 wherein said reset means comprises:
a NOR gate; and
an inverter gate;
wherein said NOR gate includes one input terminal coupled to the Q output terminal of said first RS latch and another input terminal coupled to the Q output terminal of said second RS latch and an output terminal coupled to an input terminal of said inverter gate; and
wherein said inverter qate includes an output terminal coupled to the respective R input terminals of said respective third and fourth RS latches.

17. The phase-frequency discriminator of claim 14 wherein said reset means comprises an OR gate including one input terminal coupled to the Q output terminal of said first RS latch and another input terminal coupled to the Q output terminal of said second RS latch and an output terminal coupled to the respective R input terminals of said third and fourth RS latches.

18. The phase-frequency discriminator of claim 14 wherein said reset means comprises:
   a first OR gate, including one input terminal coupled to a Q output terminal of said first RS latch and including another input terminal coupled to a Q output terminal of said second RS latch, said first OR gate including an output terminal coupled to the R input terminal of said third RS latch; and
   a second OR gate, including one input terminal coupled to a Q output terminal of said first RS latch and including another input terminal coupled to a Q output terminal of said second RS latch, said second OR gate including an output terminal coupled to the R input terminal of said fourth RS latch.

19. The phase-frequency discriminator of claim 18 wherein said first OR gate is merged to the NAND gate having the R input terminal for said third RS latch, and said second OR gate is merged to the NAND gate having the R input terminal for said fourth RS latch.

20. A phase-frequency discriminator comprising:
   a first RS latch for providing first output signals via a Q output terminal and third output signals via a $\overline{Q}$ output terminal, said first RS latch including an S input terminal for receiving first input signals and an R input terminal;
   a second RS latch for providing second output signals via a output terminal and fourth output signals via a $\overline{Q}$ output terminal, said second RS latch including an S terminal for receiving second input signals and an R input terminal;
   a third RS latch including an S input terminal coupled to the $\overline{Q}$ output terminal of said first RS latch and including a $\overline{Q}$ output terminal coupled to the R input terminal of said first RS latch, the third RS latch also having an R input terminal;
   a fourth RS latch including an S input terminal coupled to the $\overline{Q}$ output terminal of said second RS latch and including a $\overline{Q}$ output terminal coupled to the R input terminal of said second RS latch, the fourth RS latch also including an R input terminal; and
   reset means including two input terminals and an output terminal, one of the input terminals coupled to the Q output terminal of the first RS latch and the other one of the input terminals coupled to the Q output terminal of the second RS latch, the output terminal of the reset means being coupled to the respective R input terminals of the respective third and fourth RS latches and providing a reset signal to said third and fourth RS latches when said first and second input signals both have changed from a first to a second logical state, said third and fourth RS latches thereby providing a common reset of said first and second RS latches wherein, the first and second output signals change back from the second to the first logical state after a reset time between the provision of the second input signal and the common resetting of the first and second RS latches, said reset time interval being substantially long enough for the respective first and second output signals to reach full logic amplitude levels for the second logical state and wherein the difference between the first and second output signals is representative of the phase-frequency relationship between the first and second input signal.

* * * * *

UNITED STATES PATENT AND TRADEMARK OFFICE
CERTIFICATE OF CORRECTION

PATENT NO. : 4,739,278
DATED : April 19, 1988
INVENTOR(S) : G. S. DES BRISAY, JR. et al.

It is certified that error appears in the above-identified patent and that said Letters Patent is hereby corrected as shown below:

Claim 1, Col. 11, line 1, "Q" should be --$\bar{Q}$--.

Signed and Sealed this

Twenty-sixth Day of June, 1990

Attest:

HARRY F. MANBECK, JR.

Attesting Officer

Commissioner of Patents and Trademarks